(12) United States Patent
Tu et al.

(10) Patent No.: US 8,598,028 B2
(45) Date of Patent: Dec. 3, 2013

(54) GATE HEIGHT LOSS IMPROVEMENT FOR A TRANSISTOR

(75) Inventors: Che-Hao Tu, Hsinchu (TW); Chi-Jen Liu, Taipei (TW); Tzu-Chung Wang, Shengang Township, Taichung County (TW); Weilun Hong, Hsinchu (TW); Ying-Tsung Chen, Hsinchu (TW); Liang-Guang Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 21 days.

(21) Appl. No.: 13/335,771

(22) Filed: Dec. 22, 2011

(65) Prior Publication Data

US 2013/0164930 A1 Jun. 27, 2013

(51) Int. Cl.
*H01L 21/3205* (2006.01)
*H01L 21/20* (2006.01)

(52) U.S. Cl.
USPC ............ 438/595; 438/584; 438/585; 438/587

(58) Field of Classification Search
None
See application file for complete search history.

(56) References Cited

U.S. PATENT DOCUMENTS

| 7,923,321 | B2 * | 4/2011 | Lai et al. ........................ 438/230 |
| 7,927,943 | B2 | 4/2011 | Yeh et al. |
| 7,985,690 | B2 * | 7/2011 | Thei et al. ..................... 438/706 |
| 2009/0236669 | A1 * | 9/2009 | Chen et al. .................... 257/380 |
| 2010/0065915 | A1 * | 3/2010 | Chuang et al. ................ 257/369 |
| 2012/0146159 | A1 * | 6/2012 | Wang et al. ................... 257/410 |

* cited by examiner

*Primary Examiner* — Matthew Landau
*Assistant Examiner* — Priya Rampersaud
(74) *Attorney, Agent, or Firm* — Haynes and Boone, LLP

(57) ABSTRACT

The present disclosure provides a method of fabricating a semiconductor device. The method includes forming a first gate structure over an iso region of a substrate and a second gate structure over a dense region of the substrate. The dense region has a greater pattern density than the iso region. The first and second gate structures each have a respective hard mask disposed thereon. The method includes removing the hard masks from the first and second gate structures. The removal of the hard mask from the second gate structure causes an opening to be formed in the second gate structure. The method includes performing a deposition process followed by a first polishing process to form a sacrificial component in the opening. The method includes performing a second polishing process to remove the sacrificial component and portions of the first and second gate structures.

15 Claims, 9 Drawing Sheets

GATE HEIGHT LOSS IMPROVEMENT FOR A TRANSISTOR

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

Different regions of a semiconductor wafer may have different pattern densities. These different pattern densities may lead to fabrication challenges. For example, during a polishing process, a dense region (i.e., higher density region) may be polished at a greater rate than an iso region (i.e., lower density region). Consequently, devices such as transistor gates in a dense region may have a significantly different height than transistor gates in an iso region, even though they should have similar heights. The gate height difference may result in device defects such as power shorting or high gate resistance.

Therefore, while existing semiconductor fabrication methods may have taken different pattern densities into account in some ways, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
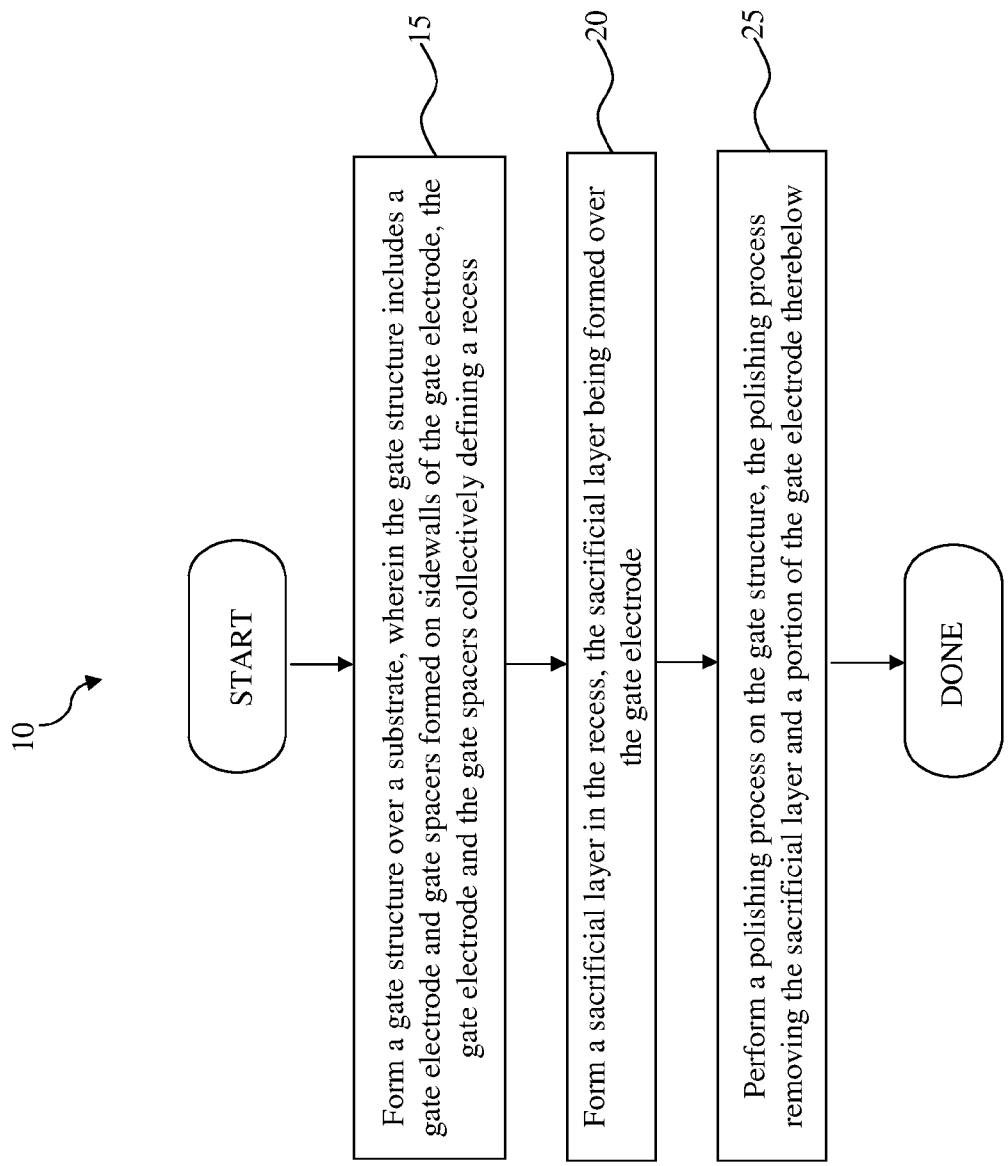
FIG. 1 is a flowchart illustrating a method of fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

Illustrated in FIG. 1 is a flowchart of a method 10 for fabricating a semiconductor device. Referring to FIG. 1, the method 10 includes a block 15 in which a gate structure is formed over a substrate. The gate structure includes a gate electrode and gate spacers formed on sidewalls of the gate electrode. The gate electrode and the gate spacers collectively define a recess. The method 10 includes a block 20 in which a sacrificial layer is formed in the recess. The sacrificial layer is formed over the gate electrode. The method 10 includes a block 25 in which a polishing process is performed on the gate structure. The polishing process removes the sacrificial layer and a portion of the gate electrode therebelow.

FIGS. 2-9 are diagrammatic fragmentary cross-sectional side views of a semiconductor device fabricated according to the method 10 of FIG. 1 during various fabrication stages. The semiconductor device may include an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that FIGS. 2-9 have been simplified for a better understanding of the inventive concepts of the present disclosure. Accordingly, it should be noted that additional processes may be provided before, during, and after the method 10 of FIG. 1, and that some other processes may only be briefly described herein.

Figure 2:
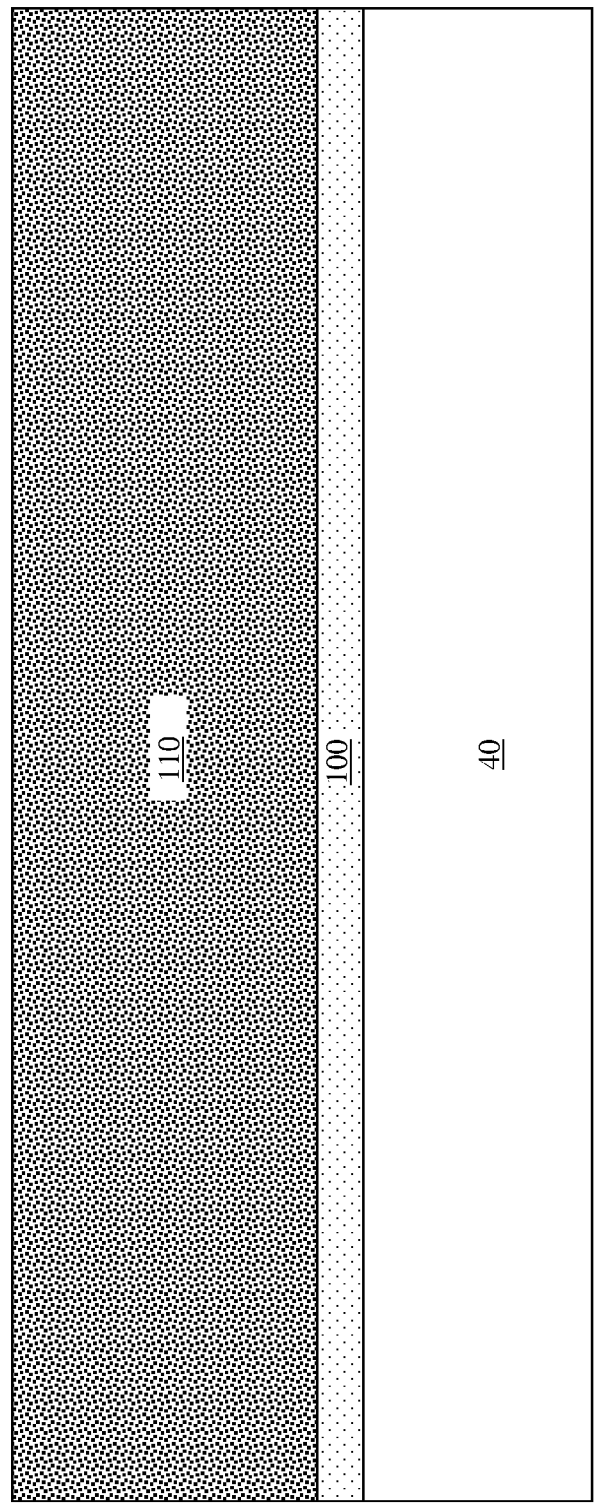
FIGS. 2 to 9 illustrate cross-sectional views of the semiconductor device at various stages of fabrication according to the method of FIG. 1.

Referring to FIG. 2, a semiconductor device 35 is fabricated in accordance with the method 10 of FIG. 1. The semiconductor device 35 has a substrate 40. The substrate 40 is a silicon substrate doped with a P-type dopant such as boron (for example a P-type substrate). Alternatively, the substrate 40 could be another suitable semiconductor material. For example, the substrate 40 may be a silicon substrate that is doped with an N-type dopant such as phosphorous or arsenic (an N-type substrate). The substrate 40 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 40 could include an epitaxial layer (epi layer), may be strained for performance enhancement, and may include a silicon-on-insulator (SOI) structure.

Shallow trench isolation (STI) features are formed in the substrate 40. The STI features are formed by etching recesses (or trenches) in the substrate and filling the recesses with a dielectric material. In the present embodiment, the dielectric material of the STI features includes silicon oxide. In alternative embodiments, the dielectric material of the STI features may include silicon nitride, silicon oxy-nitride, fluoride-doped silicate (FSG), and/or a low-k dielectric material known in the art. In other embodiments, isolation structures such as deep trench isolation (DTI) features may be formed in the substrate 40 instead of, or in addition to, the STI features. Thereafter, an interfacial layer is optionally formed over the substrate 40. The interfacial layer is formed by an atomic layer deposition (ALD) process and includes silicon oxide (SiO$_2$). For reasons of simplicity, neither the interfacial layer nor the STI or DTI features are illustrated herein.

A gate dielectric layer 100 is then formed over the interfacial layer. The gate dielectric layer 100 is formed by an ALD process. In the illustrated embodiments, the gate dielectric layer 100 includes a high-k dielectric material. A high-k dielectric material is a material having a dielectric constant that is greater than a dielectric constant of SiO$_2$, which is approximately 4. In an embodiment, the gate dielectric layer 100 includes hafnium oxide (HfO$_2$), which has a dielectric constant that is in a range from approximately 18 to approximately 40. In alternative embodiments, the gate dielectric layer 100 may include one of ZrO$_2$, Y$_2$O$_3$, La$_2$O$_5$, Gd$_2$O$_5$, TiO$_2$, Ta$_2$O$_5$, HfErO, HfLaO, HfYO, HfGdO, HfAlO, HfZrO, HfTiO, HfTaO, and SrTiO. A gate electrode layer 110 is then formed over the gate dielectric layer 100. The gate electrode layer 110 includes a polysilicon material.

Figure 3:
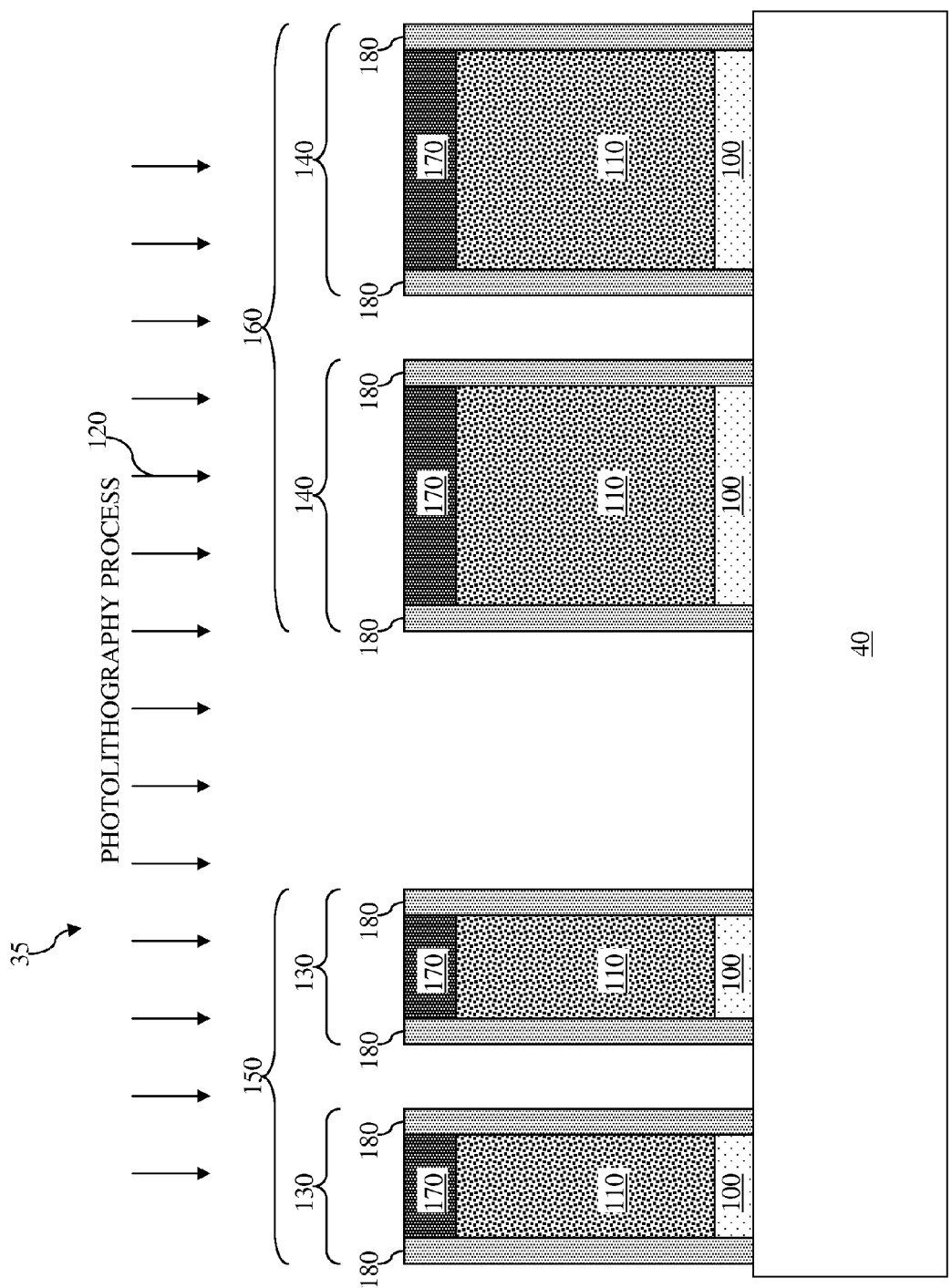

Referring to FIG. 3, a photolithography process 120 is performed to pattern the gate dielectric layer 100 and the gate electrode layer 110. The photolithography 120 process may involve one or more masking, exposing, baking, rinsing, and etching processes (not necessarily in that order). A plurality of gate structures (or gate stacks) is formed by the photolithography process 120. For the sake of providing an example, gate structures 130 and 140 are illustrated herein. The gate structures 130 are formed in a lower pattern density region of the semiconductor wafer, also referred to as an iso region 150. The gate structures 140 are formed in a higher pattern density region of the semiconductor wafer, also referred to as a dense region 160.

Each of the gate structures 130-140 formed by the photolithography process 120 includes a hard mask 170 and gate spacers 180. The hard mask 170 is used to pattern the gate electrode layer 110 and the gate dielectric layer 100 therebelow. The gate spacers 180 are formed on the sidewalls of the gate electrode layer 110 and the gate dielectric layer 100. In certain embodiments, the hard mask 170 and the gate spacers are contain different dielectric materials. At this stage of fabrication, the height of gate structures 150 in the iso region 150 is substantially similar to that of the gate structures 160 in the dense region 160. Note that the spacers 180 may each have a curved profile and may contain more than one layer (e.g., an oxide-nitride-oxide structure), but they are shown herein as rectangles for the sake of simplicity.

It is understood that a plurality of lightly doped source/drain (also referred to as LDD) regions may be formed in the substrate after the gate electrode layer 110 and the gate dielectric layer 100 have been patterned by the hard mask 170 and before the gate spacers are formed. The LDD regions may be formed by an ion implantation process or a diffusion process known in the art. Similarly, heavily doped source/drain regions may be formed in the substrate after the formation of the spacers 180. N-type dopants such as phosphorus or arsenic may be used to form NMOS devices, and P-type dopants such as boron may be used to form PMOS devices. One or more annealing processes may be performed to activate the S/D regions. For reasons of simplicity, the LDD regions and the heavily doped source/drain regions are not illustrated herein.

Figure 4:
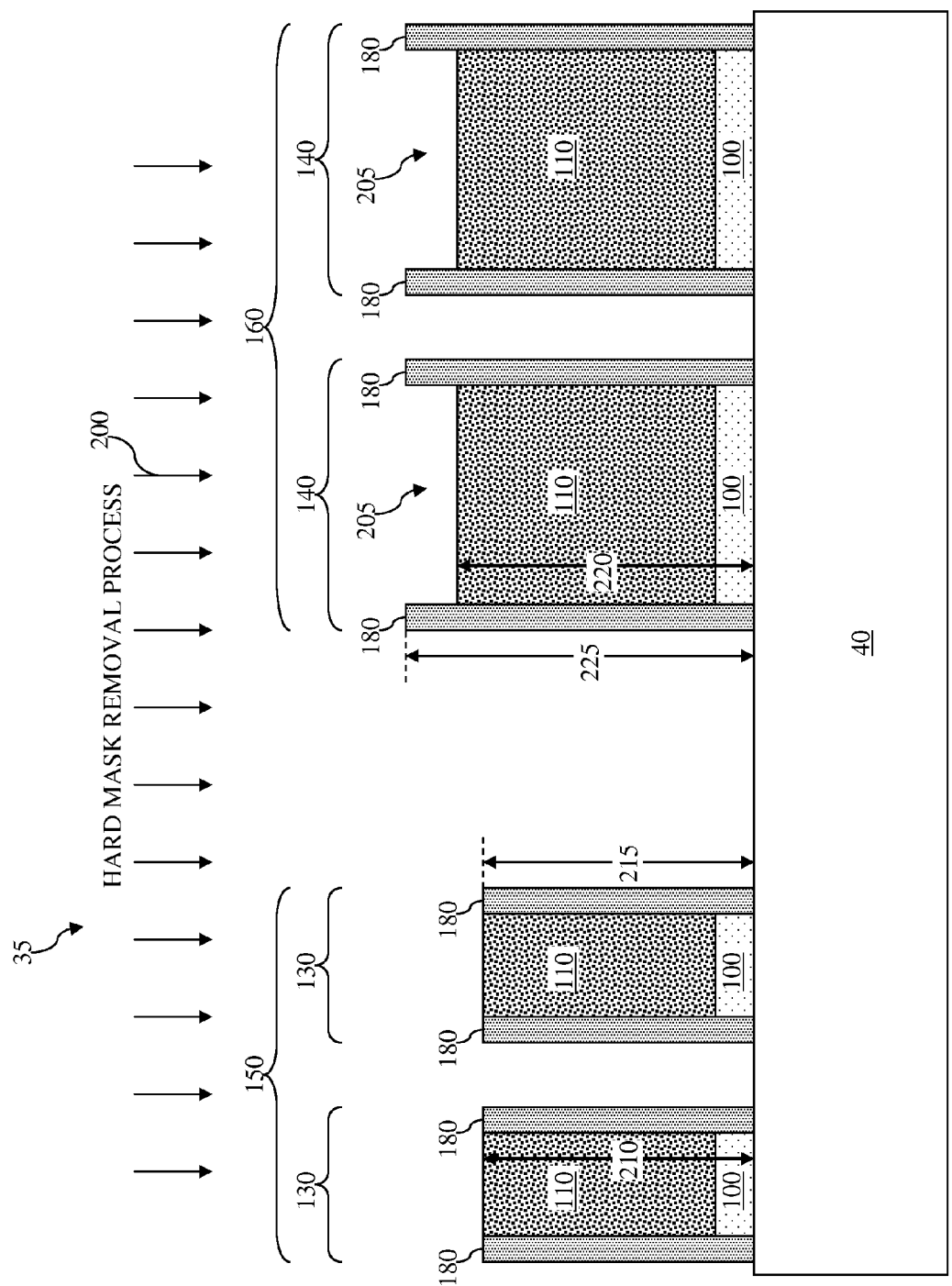

Referring now to FIG. 4, a hard mask removal process 200 is performed to the gate structures 130 and 140 to remove the hard masks 170. In some embodiments, the hard mask removal process 200 includes an etching process, which may include an etch back process. The etching selectivity for the etching process is tuned in a manner such that the hard masks 170, the gate spacers 180, and the gate electrode layer 110 have different etching rates. As a result, the spacers 180 in the dense region 160 will be taller than their corresponding gate electrode layer 110, thereby exhibiting a "fence-like" shape. Stated differently, the spacers 180 and the gate electrode layer 110 in the dense region 160 in effect define upwardly-facing openings 205 (or recesses) at the top of the gate structures 140. Meanwhile, the gate spacers 180 in the iso region 150 are no taller than their corresponding gate electrode layer 110.

In more detail, the gate electrode layer 110 in the iso region 150 has a gate height 210, and the spacers 180 in the iso region 150 have a spacer height 215. The gate electrode layer 110 in the dense region 160 has a gate height 220, and the spacers 180 in the dense region 160 have a spacer height 225. In some embodiments, the gate height 210 is in a range between about 200 Angstroms and about 800 Angstroms, the spacer height 215 is less than or equal to the gate height 210, the gate height 220 is in a range between about 200 Angstroms and about 800 Angstroms, and the spacer height 225 is greater than the gate height 220 but less than about 1000 Angstroms. In some embodiments, the gate height 220 of the dense region 160 is greater than the gate height 210 of the iso region 150, since the etching rate of the dense region 160 is slower than the etching rate of the iso region 150.

Figure 5:
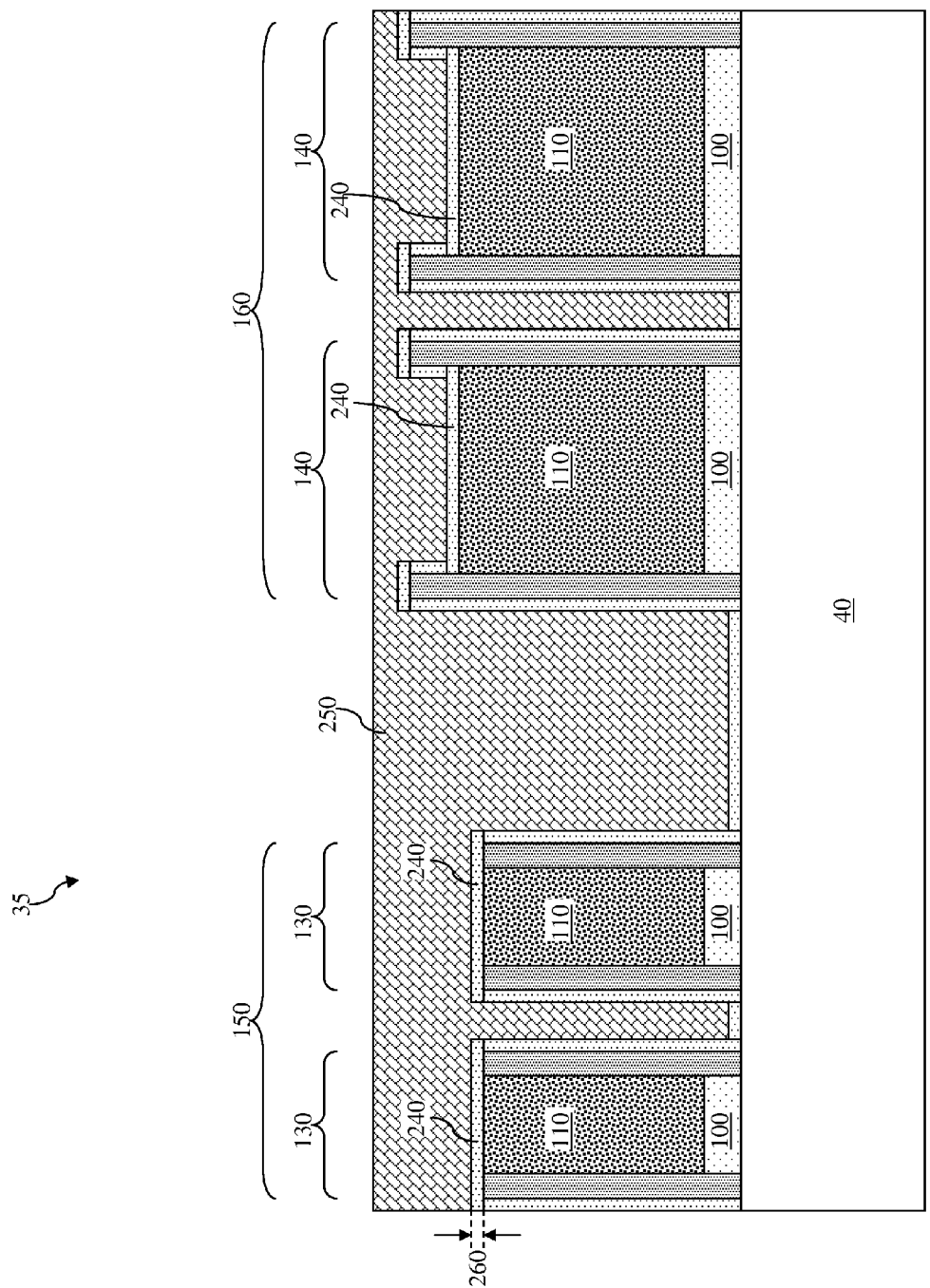

Referring now to FIG. 5, a polishing-stop layer 240 is formed over the gate structures 130-140 and over the substrate 40. Thereafter, an inter-layer (or inter-level) dielectric (ILD) layer 250 is formed over the polishing-stop layer 240 and over the gate structures 130-140. The polishing-stop layer 240 and the ILD layer 250 may each be formed by a deposition technique known in the art, for example chemical vapor deposition (CVD), high density plasma chemical vapor deposition (HDPCVD), ALD, spin-on, sputtering, or other suitable methods. The polishing-stop layer 240 and the ILD layer 250 contain different material compositions. In some embodiments, the polishing-stop layer 240 contains a nitride material, for example silicon nitride, and the ILD layer 250 contains an oxide material, for example silicon oxide. In other embodiments, the polishing-stop layer 240 and the ILD layer 250 may include other suitable materials, such as silicon oxy-nitride, silicon carbide, or low-k materials. The polishing-stop layer 240 has a thickness 260. In some embodiments, the thickness 260 is in a range between about 50 Angstroms and about 350 Angstroms.

Figure 6:
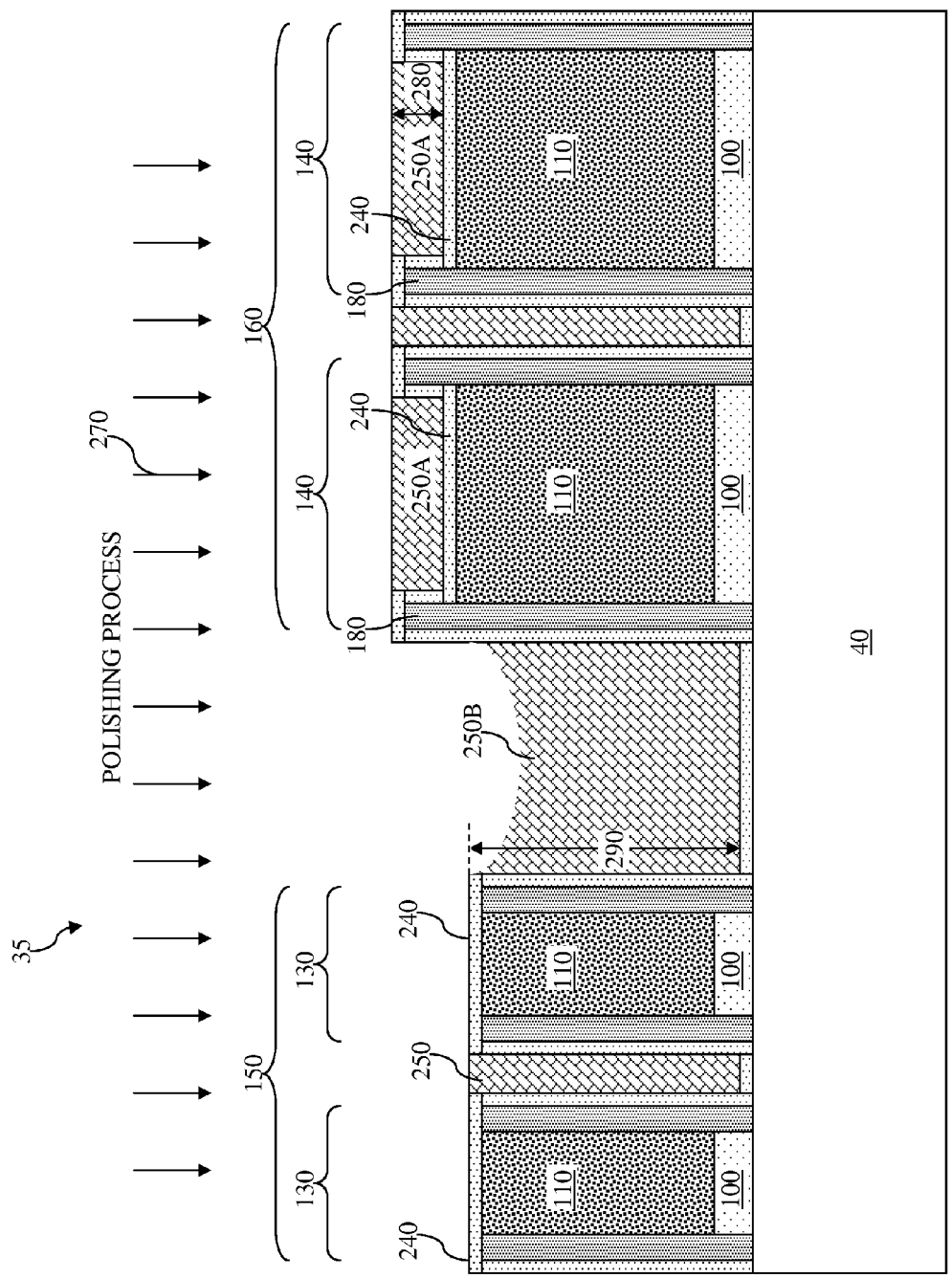

Referring to FIG. 6, a polishing process 270 is performed on the ILD layer 250. In some embodiments, the polishing process 270 includes a chemical-mechanical-polishing (CMP) process. The polishing process 270 grinds away the ILD layer 250 in both the iso region 150 and the dense region 160. Since much of the ILD layer 250 (containing silicon oxide herein) is removed by the polishing process 270, the polishing process 270 may also be referred to as a bulk oxide removal process.

A high etching selectivity (i.e., substantially different etching rates) exists between the ILD layer 250 and the polishing-stop layer 240 for the etching process 270. In certain embodiments, the etching selectivity between the ILD layer 250 and the polishing-stop layer 240 is about 40:1. The polishing-stop layer 240 serves as an end point detection mechanism. For example, when the polishing process 270 "detects" the presence of silicon nitride (i.e., the material composition of the polishing-stop layer 240 according to some embodiments), it is understood that the ILD layer 250 above the polishing-stop layer 240 has been removed, and the polishing process 270 will stop. The "detection" and the stopping of the polishing process 270 may be automated by a semiconductor processing tool, for example a computerized controller.

Since the spacers 180 in the dense region 160 form "fence-like" structures, portions of the ILD layer 250A remain over the gate structures 140 in the dense region 160, even after the polishing process 270 is performed. In other words, the openings 205 (FIG. 4) defined by the spacers fences are filled by portions of the ILD layer 250A. These portions of the ILD layer 250A are not removed by the polishing process 270 because the polishing process 270 will stop when it reaches the polishing stop layer 180. These remaining portions of the ILD layer 250A may also be referred to as sacrificial layers 250A. The sacrificial layers 250A have a thickness 280. In some embodiments, the thickness 280 is in a range between about 100 Angstroms and about 600 Angstroms.

Also as illustrated in FIG. 6, different portions of the ILD layer 250 may remain at the various spaces between the gate structures 130 and gate structures 140. A portion 250B of the ILD layer remaining between the gate structures 130 and 140 has a thickness 290. In some embodiments, the thickness 290 is in a range between about 200 Angstroms and about 1000 Angstroms.

Figure 7:
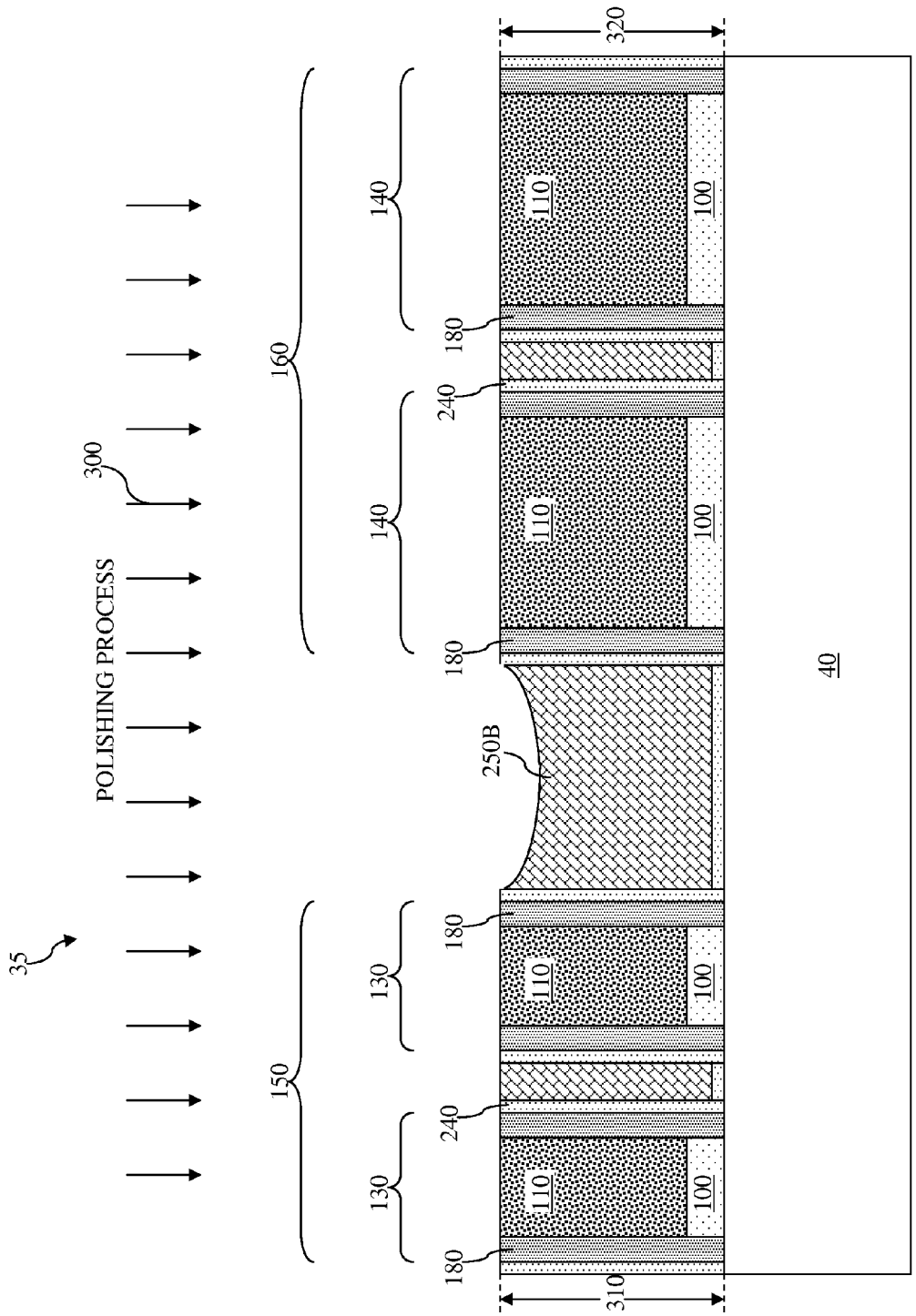

Referring now to FIG. 7, another polishing process 300 is performed on the gate structures 130-140. In some embodiments, the polishing process 300 includes a CMP process. The polishing process 300 grinds away portions of the gate structures 130-140 (and the portions of the ILD layer 250 and the polishing-stop layer 240 formed thereon) in both the iso region 150 and the dense region 160.

A relatively high etching selectivity exists between the ILD layer 250 and the polishing-stop layer 240 for the etching process 300. In certain embodiments, the etching selectivity between the polishing-stop layer 240 and gate electrode layer 110 (containing polysilicon in the embodiments shown herein) is about 8:1. The polishing process 300 is performed for a predetermined process duration (i.e., the amount of polishing time). The process duration can be adjusted to tune the amount of the various materials removed by the polishing process 300.

At the completion of the polishing process 300, the sacrificial layers 250A on the gate structures 140 is removed, as are the polishing-stop layer 240, the ILD layer 250, and portions of the gate electrode layer 110 for both the gate structures 130 and 140. The gate structures 130 now have a reduced height 310, and the gate structures 140 have a reduced height 320. In some embodiments, the gate height 310 and gate height 320 are each in a range between about 200 Angstroms and about 700 Angstroms.

For a polishing process (such as a CMP process), the polishing rate is typically significantly higher in a dense region than an iso region on a wafer. Consequently, if this difference in polishing rates is not properly taken into account, features such as gate structures in the dense region will lose more height than features in the iso region. This is often what takes place in traditional fabrication methods. When the height of the gate structures in the dense region is reduced too much, then defects such as power shorting and/or excessive gate resistance may occur.

In comparison, the embodiments of the present disclosure utilize the sacrificial layers 250A as a buffer component to compensate for the higher polishing rates of the dense region 160. In other words, though the gate structures 140 in the dense region 160 are removed at a higher rate than the gate structures 130 in the iso region 150, the addition of the sacrificial layer 250A helps "slow down" this effect, as the gate structures 140 in effect are taller than the gate structures 130. As such, the gate height difference between the gate structures 130 and 140 is substantially minimized. In some embodiments, the difference between the gate heights 310 and 320 is less than about 50 Angstroms. Therefore, the present disclosure avoids defects such as power shorting and/or excessive gate resistance associated with traditional fabrication methods.

Figure 8:
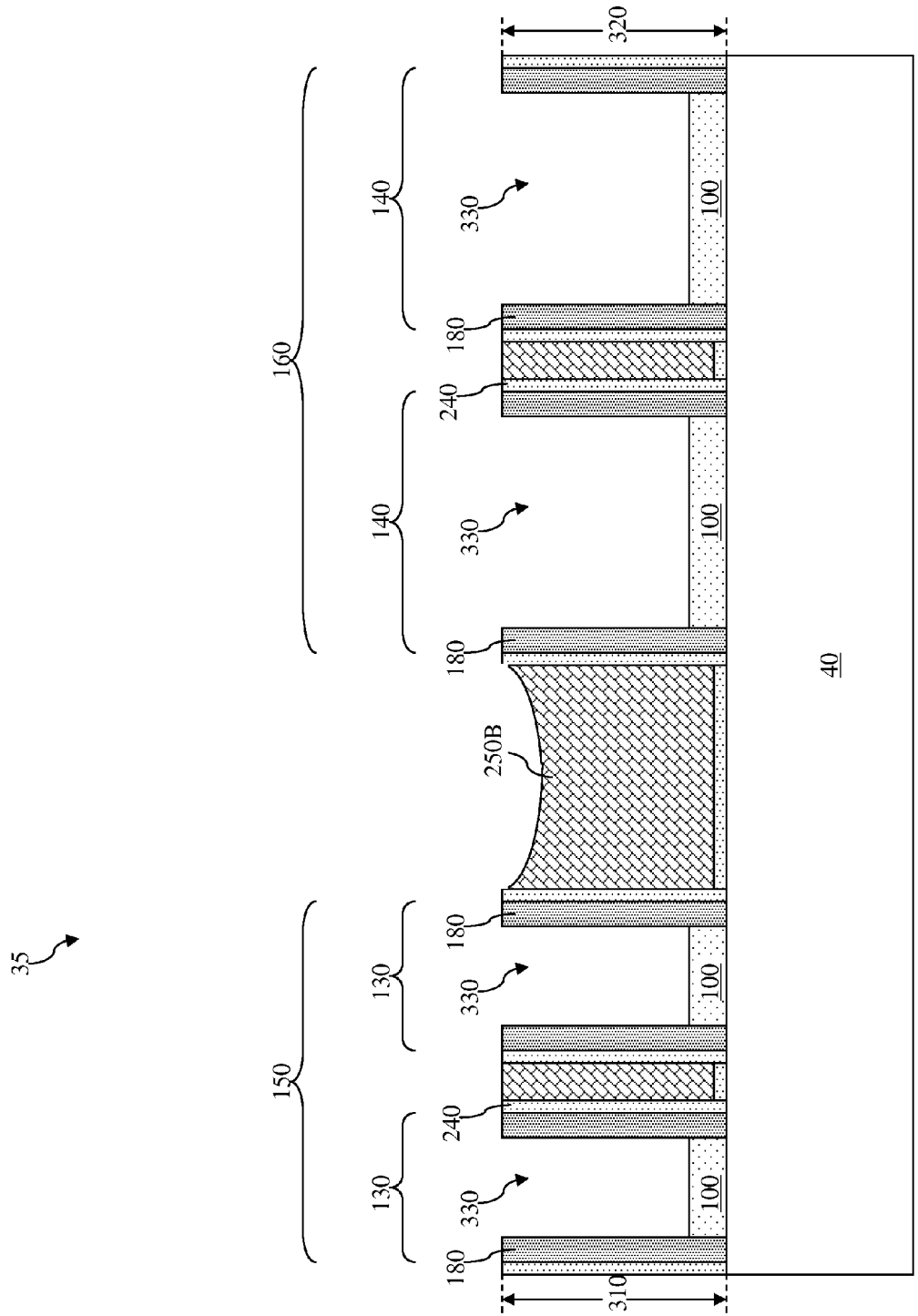

Referring now to FIG. 8, the gate electrode layer 110 is removed, thereby forming trenches (or openings) 330 in place of the removed gate electrode layer 110. The gate electrode layer 110 may be removed in a wet etching or a dry etching process known in the art, while the rest of the layers of the semiconductor device 35 remain substantially un-etched, including the gate dielectric layer 100, the gate spacers 180, and the ILD layer 250. Since the gate electrode layer 110 is removed and is not used in actual device operation, the electrode layer 110 is also referred to as a "dummy gate electrode layer."

Figure 9:
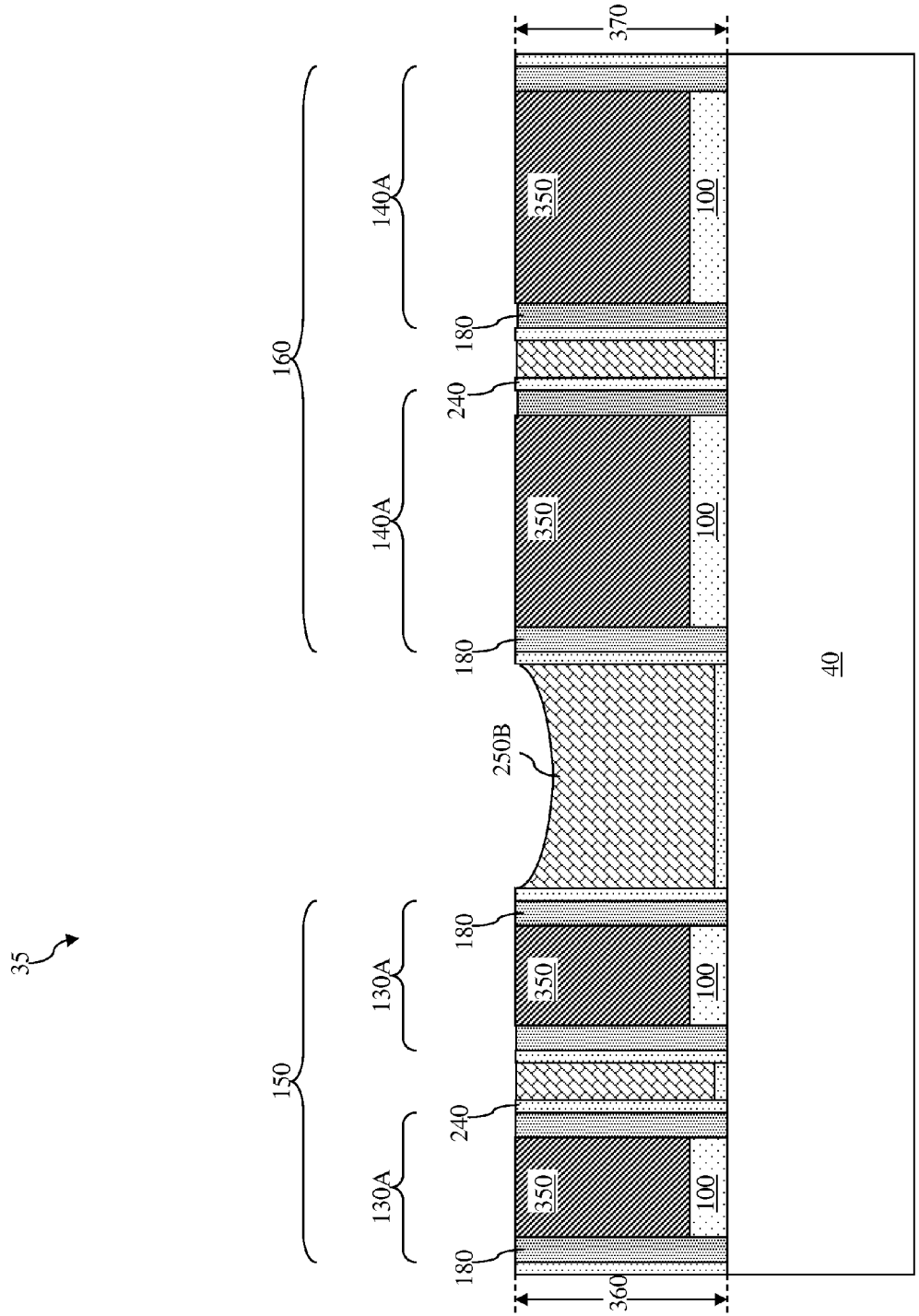

Referring now to FIG. 9, metal gate electrodes 350 are formed to fill the trenches 330. The metal gate electrodes 350 are formed on the gate dielectric layer 100. The metal gate electrode 350 may be formed by a plurality of deposition processes, such as CVD, physical vapor deposition (PVD), ALD, or plating, followed by a polishing process, such as a CMP process. The metal gate electrodes 350 may each include a work function metal portion, which tunes a work function of its corresponding transistor to achieve a desired threshold $V_t$ voltage. In some embodiments, the work function metal portion includes at least one of: TiN, TaN, TaC, TaSiN, WN, TiAl, TiAlN, or combinations thereof. The work function metal portion may alternatively include other metal materials that are suitable for application or manufacturing considerations. The metal gate electrodes 350 may also each include a metal portion that serves as the main conductive portion of the gate electrodes 350, which may be referred to as a fill metal portion. In some embodiments, the fill metal portion may include at least one of Tungsten (W), Aluminum (Al), Copper (Cu), and combinations thereof. For reasons of simplicity, the work function metal portion and the fill metal portion are not separately illustrated herein.

Metal gate structures 130A and 140A are formed by the replacing of dummy polysilicon gate electrodes 110 with metal gate electrodes 350. The metal gate structures 130A and 140A have respective gate heights 360 and 370. The gate heights 360 and 370 may be slightly less than the gate heights 310 and 320, which may be due at least in part to the polishing process used to form the metal gate structures 130A-140A. In some embodiments, the gate heights 360-370 are each in a range between about 100 Angstroms and about 600 Angstroms. Compared to the "original" gate heights 210 and 220 (of the dummy polysilicon gate structures 130 and 140), the metal gate structures 130A and 140A are smaller by about 0 Angstroms to about 200 Angstroms. In other words, the metal gate structures 130A and 140A each have a "gate loss" between about 0 Angstroms and about 200 Angstroms. In comparison, the traditional fabrication methods would have yielded a substantially greater gate loss for gate structures in the dense region than for gate structures in the iso region, due to the significantly different polishing rates between these two regions.

It is understood that additional processes may be performed to complete the fabrication of the semiconductor device 35. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The embodiments discussed above with reference to FIGS. 1-9 illustrate a "gate last" approach of a gate replacement fabrication process. It is understood that the various aspects of the present disclosure may also apply to a "high-k last" approach of the gate replacement process. In the high-k last process, the gate dielectric layer 100 (FIG. 2) includes silicon oxide instead of a high-k dielectric material. The oxide gate dielectric layer 100 in the high-k last process also serves as a dummy layer and will be removed later along with the dummy polysilicon gate electrode layer 110. The removal of the dummy gate dielectric layer 100 and the dummy gate electrode layer 110 form trenches. A high-k gate dielectric layer is then formed in each of the trenches, and then a metal gate electrode layer is formed over the high-k gate dielectric layer in each of the trenches to form metal gate structures. According to the various aspects of the present disclosure, the fence-like spacers may be formed in this high-k last process to form a sacrificial layer, which will help achieve more uniformity between the gate heights of the gate structures despite the differences in polishing rates between the iso region 150 and the dense region 160.

One of the broader forms of the present disclosure involves a method of fabricating a semiconductor device. The method includes: forming a first gate structure over an iso region of a substrate and a second gate structure over a dense region of the substrate, wherein the dense region has a greater pattern density than the iso region, and wherein the first and second gate structures each have a respective hard mask disposed thereon; removing the hard masks from the first and second gate structures, wherein the removing of the hard mask from the second gate structure causes an opening to be formed in the second gate structure; performing a deposition process followed by a first polishing process to form a sacrificial component in the opening; and performing a second polishing process to remove the sacrificial component and portions of the first and second gate structures.

Another one of the broader forms of the present disclosure involves a method of fabricating a semiconductor device. The method includes: forming a gate structure over a substrate, wherein the gate structure includes a gate electrode and gate spacers formed on sidewalls of the gate electrode, the gate electrode and the gate spacers collectively defining a recess; forming a sacrificial layer in the recess, the sacrificial layer being formed over the gate electrode; and performing a polishing process on the gate structure, the polishing process removing the sacrificial layer and a portion of the gate electrode therebelow.

Yet another of the broader forms of the present disclosure involves a method of fabricating a semiconductor device. The method includes: forming a gate dielectric layer over a substrate; forming a dummy gate electrode layer over the gate dielectric layer, the dummy gate electrode layer containing a polysilicon material; patterning the dummy gate electrode layer and the gate dielectric layer with patterned hard masks to forming a first gate structure and a second gate structure, wherein the first gate structure is formed in a region of the substrate having a pattern density lower than that of the second gate structure; performing a hard mask removal process to remove the hard masks, wherein the hard mask removal process is performed in a manner such that the second gate structure has fence-like gate spacers after the hard masks are removed; thereafter forming a polishing-stop layer over the first and second gate structures; forming an interlayer dielectric (ILD) layer over the polishing-stop layer; polishing the ILD layer until the polishing-stop layer has been reached, wherein a portion of the ILD layer remains on the second gate structure and is surrounded by the fence-like gate spacers after the polishing; polishing the first and second gate structures until an upper surface of the first and second gate structures are free of the polishing-stop layer and the ILD layer; and thereafter replacing the dummy gate electrode layer of the first and second gate structures with metal gate electrodes.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    forming a first gate structure over an iso region of a substrate and a second gate structure over a dense region of the substrate, wherein the dense region has a greater pattern density than the iso region, and wherein the first and second gate structures each have a respective hard mask disposed thereon, wherein the first and second gate structures each include a respective polysilicon gate electrode and respective gate spacers formed on opposite sidewalls of the polysilicon gate electrode;
    removing the hard masks from the first and second gate structures, wherein the removing of the hard mask from the second gate structure causes an opening to be formed in the second gate structure, the opening being defined by the gate spacers of the second gate structure and the polysilicon gate electrode of the second gate structure, wherein the gate spacers of the second gate structure are taller than the polysilicon gate electrode of the second gate structure;
    performing a deposition process followed by a first polishing process to form a sacrificial component in the opening;
    performing a second polishing process to remove the sacrificial component and portions of the first and second gate structures; and
    thereafter replacing the polysilicon gate electrodes of the first and second gate structures with metal gate electrodes.

2. The method of claim 1, wherein the forming the sacrificial component comprises:
    depositing a polishing-stop layer over the first and second gate structures, the polishing-stop layer partially filling the opening in the second gate structure;
    depositing an interlayer dielectric (ILD) component over the polishing-stop layer, the ILD component and the polishing-stop layer containing different materials; and
    performing a chemical-mechanical-polishing (CMP) process to remove portions of the ILD component until the polishing-stop layer has been reached;
    wherein the sacrificial component is formed by a portion of the ILD component residing in the opening after the CMP process is completed.

3. The method of claim 1, wherein the performing the second polishing process is carried out in a manner such that the first and second gate structures have substantially similar gate heights after the second polishing process is completed.

4. A method of fabricating a semiconductor device, comprising:
- forming a gate structure over a substrate, wherein the gate structure includes a gate electrode and gate spacers taller than the gate electrode formed on sidewalls of the gate electrode, the gate electrode and the gate spacers collectively defining a recess in the gate structure, wherein the gate electrode is a dummy polysilicon gate electrode;
- forming a sacrificial layer in the recess, the sacrificial layer being formed over the gate electrode;
- performing a polishing process on the gate structure, the polishing process removing the sacrificial layer and a portion of the gate electrode therebelow; and
- thereafter replacing the dummy polysilicon gate electrode with a metal gate electrode.

5. The method of claim 4, wherein the forming the gate structure includes:
- forming a gate electrode layer over the substrate;
- forming a patterned hard mask over the gate electrode layer;
- patterning the gate electrode layer with the patterned hard mask, thereby forming the gate electrode of the gate structure;
- forming the gate spacers on the sidewalls of the gate electrode and the hard mask; and
- removing the hard mask, thereby forming the recess in the gate structure.

6. The method of claim 5, wherein the recess is an upwardly-facing recess.

7. The method of claim 4, wherein the forming the sacrificial layer includes:
- forming a first dielectric layer over the gate structure;
- forming a second dielectric layer over the first dielectric layer, the first and second dielectric layers having different material compositions; and
- performing a further polishing process to the gate structure to remove portions of the second dielectric layer, wherein the sacrificial layer is formed by a portion of the second dielectric layer remaining in the recess after the further polishing process is performed.

8. The method of claim 7, wherein the further polishing process is configured such that the first dielectric layer and the second dielectric layer have substantially different etching rates.

9. The method of claim 7, wherein:
- the first dielectric layer contains silicon nitride and is a polishing-stop layer during the further polishing process; and
- the second dielectric layer contains silicon oxide.

10. The method of claim 4, wherein the gate structure is formed in a dense region of a semiconductor wafer.

11. The method of claim 10, further comprising: forming a further gate structure in an iso region of the semiconductor wafer;
wherein:
- the dense region has a greater pattern density than the iso region; and
- the further gate structure is free of having a sacrificial layer formed thereon.

12. The method of claim 11, wherein:
- the performing polishing process also removes a portion of the further gate structure; and
- a first height of the gate structure is approximately equal to a second height of the further gate structure after the polishing process is completed.

13. A method of fabricating a semiconductor device, comprising:
- forming a gate dielectric layer over a substrate;
- forming a dummy gate electrode layer over the gate dielectric layer, the dummy gate electrode layer containing a polysilicon material;
- patterning the dummy gate electrode layer and the gate dielectric layer with patterned hard masks to forming a first gate structure and a second gate structure, wherein the first gate structure is formed in a region of the substrate having a pattern density lower than that of the second gate structure;
- performing a hard mask removal process to remove the hard masks, wherein the hard mask removal process is performed in a manner such that the second gate structure has fence-like gate spacers after the hard masks are removed, wherein the fence-like gate spacers are taller than the dummy gate electrode layer of the second gate structure, and wherein the fence-like gate spacers and the dummy gate electrode portion collectively define an upwardly-facing recess at an upper portion of the second gate structure;
- thereafter forming a polishing-stop layer over the first and second gate structures;
- forming an interlayer dielectric (ILD) layer over the polishing-stop layer;
- polishing the ILD layer until the polishing-stop layer has been reached, wherein a portion of the ILD layer remains on the second gate structure and is surrounded by the fence-like gate spacers after the polishing;
- polishing the first and second gate structures until an upper surface of the first and second gate structures are free of the polishing-stop layer and the ILD layer; and
- thereafter replacing the dummy gate electrode layer of the first and second gate structures with metal gate electrodes.

14. The method of claim 13, wherein the polishing the first and second gate structures is performed until the first and second gate structures have approximately similar gate heights.

15. The method of claim 13, wherein:
- the first polishing process is tuned such that a first etching selectivity exists between the polishing-stop layer and the ILD layer;
- the second polishing process is tuned such that a second etching selectivity exists between the polishing-stop layer and the gate electrode layer; and
- the second etching selectivity is smaller than the first etching selectivity.

* * * * *